United States Patent [19]
Fasano et al.

[11] Patent Number: 6,139,666
[45] Date of Patent: Oct. 31, 2000

[54] METHOD FOR PRODUCING CERAMIC SURFACES WITH EASILY REMOVABLE CONTACT SHEETS

[75] Inventors: Benjamin V. Fasano, New Windsor; Richard F. Indyk, Wappingers Falls, both of N.Y.; Sundar M. Kamath, San Jose, Calif.; Scott I. Langenthal, Hyde Park; Srinivasa S. Reddy, Lagrangeville, both of N.Y.

[73] Assignee: International Business Machines Corporation, Armonk, N.Y.

[21] Appl. No.: 09/320,535

[22] Filed: May 26, 1999

[51] Int. Cl.$^7$ .............................. B32B 31/00; C03B 29/00
[52] U.S. Cl. ..................... 156/85; 156/89.16; 156/89.18; 264/642; 264/672
[58] Field of Search .................................. 156/85, 89.16, 156/89.18; 264/642, 672

[56] References Cited

U.S. PATENT DOCUMENTS

| | | |
|---|---|---|
| 2,966,719 | 1/1961 | Park, Jr. . |
| 3,698,923 | 10/1972 | Stetson et al. . |
| 4,753,694 | 6/1988 | Herron et al. ........................ 156/89.16 |
| 4,756,959 | 7/1988 | Ito et al. ................................... 428/323 |
| 4,769,294 | 9/1988 | Barringer et al. . |
| 5,085,720 | 2/1992 | Mikeska et al. ..................... 156/89.16 |
| 5,130,067 | 7/1992 | Flaitz et al. . |
| 5,254,191 | 10/1993 | Mikeska et al. . |
| 5,277,723 | 1/1994 | Kodama et al. . |
| 5,387,474 | 2/1995 | Mikeska et al. . |
| 5,502,013 | 3/1996 | James . |

OTHER PUBLICATIONS

A Cofired Bump Bonding Technique for Chip–Scale–Package Fabrication Using Zero X–Y Shrinkage Low Temperature Cofired Ceramic Substrate, Minehiro Itagaki, Nobuhiro Hase, Satoru Yuhaku, Yoshihiro Bessho and Kazuo Eda, Matsushita Electric Industrial Co., Ltd. Device Engineering Development Center, 1006, Kadoma, Kadoma–shi, Osaka, 571 Japan, *1997 International Symposium on Microelectronics*, pp 685–690.

*Primary Examiner*—Christopher A. Fiorilla
*Attorney, Agent, or Firm*—DeLio & Peterson LLC; John J. Tomaszewski; Aziz M. Ahsan

[57] ABSTRACT

A method for making multilayer ceramic substrates having substantially reduced planar shrinkage and distortion resulting from the firing or sintering process. Contact sheets are employed in the fabrication process on the surface of the multilayer ceramic substrate to be fired with the contact sheets being prepared from a composition containing a non-sinterable non-metallic inorganic material such as alumina having an average particle size approximately about 1 micron or less and an organic binder and preferably a plasticizer. In a preferred embodiment of the invention, the multilayer structure to be fired containing the contact sheet of the invention is provided with a beveled or chamfered edge at an angle of greater than about 60 degrees. A fabrication process employing only chamfering of the edge or the use of a contact sheet of the invention also provides improved multilayer ceramic substrate products. A further feature is a method to control the surface topography of surface metallization by adjusting the compressibility of the contact sheets during fabrication of the substrate.

7 Claims, 5 Drawing Sheets

METHOD FOR PRODUCING CERAMIC SURFACES WITH EASILY REMOVABLE CONTACT SHEETS

BACKGROUND OF THE INVENTION

1. Field of the Invention

The present invention relates to compositions and methods for making multilayer ceramic substrates from ceramic greensheets by sintering, and, in particular, to substantially reducing and controlling planar shrinkage, minimizing distortion and controlling surface feature topography of the sintered ceramic greensheets caused by the sintering process.

2. Description of Related Art

Ceramics have found wide spread use in electronics as a substrate for integrated circuit packages. Metallized circuit patterns are applied to the ceramic substrate in the form of a greensheet and the ceramic and metallization are co-sintered to create a monolith of substrate and circuitry. In general, multilayer ceramic packages are constructed by combining ceramic particles and organics binders into unfired, or greensheet, tapes. Inter-layer conductive paths, known as vias, are then inserted (punched) through the greensheet, forming electrical interconnection between the circuits on each greensheet layer after they are stacked and processed. Metallized circuit patterns are applied to the punched greensheets as is well-known in the art and multiple layers of punched and metallized tapes are stacked and laminated under pressure. The ceramic and metallization laminate is then co-sintered to form a monolithic structure with three dimensional circuitry.

The casting of suspensions of ceramic material to form layers or greensheets which are then sintered to produce a ceramic substrate material is known in the art. The doctor blade method is one method for producing a ceramic greensheet. Typically, ceramic powder is mixed with an organic solvent, a plasticizer and a binder forming a slurry, the slurry is cast in a regulated thickness on a carrier film with the aid of a doctor blade, and the applied layer of the slurry is then dried. The ceramic suspension formula is typically alumina and a butyral resin like polyvinyl butyral. A cellulose type resin like ethyl cellulose or polyvinyl alcohol is also typically used as the binder.

As part of the multilayer ceramic substrate fabrication process, the tape layers are punched and metallized and stacked in registry and pressed together at a preselected temperature and pressure to form a monolithic structure and then fired at an elevated temperature to drive off the organic binder and then finally sintered to densify the multilayer substrate. During sintering however, the stacked laminate densifies and shrinks and the shrinkage is difficult to control. To control the dimensional and electrical circuit integrity of the stacked greensheet laminate, pressure sintering or hot pressing the ceramic body during sintering with an externally applied load is a well known method for controlling the shape (dimensions) of the sintered ceramic part. This process however has a tendency for cross-contamination to occur between the part and the pressure mold and application of a force during burnout of the organic binder may restrict the escape of volatiles causing incomplete burn out and/or distortion of the sintered ceramic.

Other processes include the use of a constraint applied to the outer edges (periphery) of the part providing an open escape path for volatiles and an entry path for oxygen. In another process a co-extensive force is applied to the entire surface of the part to be sintered by either using co-extensive porous platens or by application of an air-bearing force. In another approach a frictional force is applied to the sintering body by use of contact sheets comprised of a porous composition which do not sinter or shrink during the heating cycle; thus prevents shrinkage of the ceramic in the plane of the contact sheet (XY plane) and allows shrinkage in the direction perpendicular to the plane of the contact sheet (Z directions). The composition of the contact sheet is selected so that it remains porous during firing, does not fuse to the ceramic, is thermally stable so that it will essentially not shrink or expand during the sintering cycle, and has continuous mechanical integrity/rigidity. The contact sheets generally maintain their dimensions during the sintering cycle thus restricting or minimizing the ceramic parts from shrinking in the plane of the contact sheet (XY direction).

The use of contact sheets however, presents other problems in the fabrication of the multilayer ceramic substrate. For one, contact sheets after sintering must be removed from the sintered substrate by one of several abrasive processes (e.g., lapping, polishing, grinding, scrubbing, brushing, or media blasting). All of these processes can damage the underlying substrate surface metal features and ceramic surfaces. In many applications the degree of distortion control and surface finish or surface roughness with the conventional contact sheet is adequate; however, fine pitch wiring ground rules and thin film metallurgy deposition on large ceramic substrates requires improvements in distortion control and minimal surface roughness.

Multilayer ceramic substrates are often produced by combining metallized and unfired ceramic layers into a laminate with contact sheets on the outer surfaces and then cutting these in the unfired state into smaller substrates. These substrates are then heated to consolidate the ceramic and metal powders during which time considerable dimensional shrinkage occurs.

These low temperature cofired ceramic substrates built with contact sheets from greensheet laminates typically exhibit a concave side profile after sintering. This is demonstrated in FIGS. A–1C as described hereinbelow. The resulting sharp edges are very fragile and chip very easily. It is known to provide a conventional 45° chamfer machined into the edges of the substrate prior to sintering so that the edges are less prone to chipping. However, a lip or burr often forms on the top and/or bottom sides of the substrate after the contact sheet is removed.

This is demonstrated in FIGS. 3A–3D. This lip or burr can interfere with downstream processes requiring a planar surface (e.g., pin or solder ball joining). When such a lip or burr occurs the sintered part may need to be subjected to an expensive post-sinter machining process, (e.g., lapping, polishing, grinding, etc.) to remove the lip or burr and to provide a planar surface. The lip or burr will be most severe for thick contact sheets.

Another problem with the use of conventional contact sheets is the roughness of the ceramic substrate surface after sintering and removal of the contact sheet which may also require a planarizing operation such as lapping or grinding to provide the required smooth surface needed for thin film wiring integrity, lid sealing or other such electronic component fabrication processes.

A number of patents have issued in this area addressing the problem of controlling dimensional integrity of the multilayer ceramic substrate during sintering. U.S. Pat. No. 5,277,723 describes a method of controlling substrate sintering X-Y orthogonality and edge concavity in parts built with non-sintering constraining layers (contact sheets). The method essentially controls these parameters by variation of the constraining force applied to the substrate during sintering. U.S. Pat. Nos. 5,254,191 and 5,387,474 describe the use of a constraining layer to control substrate sintering X-Y shrinkage and distortion. The ceramic powder used in these patents has an average size between about 1 and 20 microns with less than 30% being finer than one micron.

In the Itagaki et al. paper entitled A CoFired Bump Bonding Technique For Chip-Scale Package Fabrication Using Zero X-Y Shrinkage Low Temperature CoFired Ceramic Substrate published Oct. 12, 1997, a process is described to build a ceramic substrate with positive height metal bumps to which semiconductor chips can be bonded. The contact sheet used in the process is described only as being alumina.

Still another problem with using non-sintering contact sheets is that often their microstructure has very little porosity and when laminated as a greensheet onto surface metal features which are located on the outermost layers of the multilayer ceramic laminate, the surface features are pressed completely into the surface of the ceramic. This may be undesirable when electrically conductive metal pads on the surface of the substrate which protrude above the ceramic substrate surface are desired for solderless electrical connection to Land Grid Array (LGA) conductive contacts.

Bearing in mind the problems and deficiencies of the prior art, it is therefore an object of the present invention to provide a composition and method for making multilayer ceramic substrates from ceramic greensheets by sintering which multilayer ceramic substrates have improved X-Y dimensional integrity and edge and side integrity.

It is another object of the present invention to provide contact sheets which provide enhanced dimensional integrity when used as a top and/or bottom layer on a ceramic greensheet stack which is to be sintered in the fabrication of multilayer ceramic substrates.

In a further aspect of the invention, the control of surface metallized feature height above the ceramic is made possible by adjusting the microstructure of the greensheet to incorporate porosity into the greensheet, the thickness of the contact sheet, the compliance of this contact sheet and the compliance of the backing material used between the contact sheet and rigid plates used during the uniaxial lamination process.

In yet another aspect of the invention, a contact sheet is disclosed which is easily removed from the ceramic by ultrasonic cleaning, dry abrasive blasting, or wet abrasive blasting leaving the underlying metallurgy free from residual contact sheet material.

Another object of the invention is to provide a method for minimizing the sharp edge that results from green sizing parts that are subsequently sintered using contact sheets by using an edge chamfer greater than about 60 degrees.

Yet another object of the invention is to produce a very fine surface finish on the outermost ceramic layers after removal of the contact sheet after sintering.

In a further aspect of the invention, the microstructure of the contact sheet is modified to control the topography of metallized features on the surface of the substrate produced using contact sheets.

Another object of the present invention is to provide multilayer ceramic substrates made using the contact sheet compositions and/or methods of the invention.

Still other objects and advantages of the invention will in part be obvious and will in part be apparent in the specification.

SUMMARY OF THE INVENTION

The above and other objects, which will be apparent to those skilled in the art, are achieved by the present invention which, in a first aspect, relates to a method for making multilayer ceramic substrates having enhanced dimensional integrity from ceramic greensheets by sintering comprising the steps of:

stacking a plurality of greensheets having metallurgical circuitry within and thereon and which will form a multilayer ceramic substrate when sintered;

forming a contact sheet comprising a non-sinterable, non-metallic inorganic material having an average particle size less than about one micron and an organic binder;

positioning the contact sheet on at least one surface of the stack;

forming a laminate by adhering the contact sheet and greensheets together, usually under conditions of elevated temperature and pressure;

sintering the contact sheet containing laminate to form the multilayer ceramic substrate; and removing the contact sheet.

In another aspect, the present invention relates to a method for making multilayer ceramic substrates having enhanced dimensional integrity from ceramic greensheets by sintering comprising the steps of:

stacking a plurality of greensheets having metallurgical circuitry within and thereon and which will form a multilayer ceramic substrate when sintered;

forming a contact sheet comprising a non-sinterable, non-metallic inorganic material and an organic binder;

positioning the contact sheet on at least one surface of the stack;

forming a laminate by adhering the contact sheet and greensheets together, usually under conditions of elevated temperature and pressure;

forming a chamfer around preferably all the edges of the laminate containing contact sheet, the chamfer angle being greater than about 60° in relation to the surface of the contact sheet;

sintering the chamfered contact sheet containing laminate to form a multilayer ceramic substrate; and removing the contact sheet.

In another aspect, the present invention relates to a method for making multilayer ceramic substrates having enhanced dimensional integrity from ceramic greensheets by sintering comprising the steps of:

stacking a plurality of greensheets having metallurgical circuitry within and thereon and which will form a multilayer ceramic substrate when sintered;

forming a contact sheet comprising a non-sinterable, non-metallic inorganic material having an average particle size of less than one micron and an organic binder;

positioning the contact sheet on at least one surface of the stack;

forming a laminate by adhering the contact sheet and greensheets together, usually under conditions of elevated temperature and pressure;

forming a chamfer around preferably all the edges of the laminate containing contact sheet, the chamfer angle being greater than about 60° in relation to the surface of the contact sheet; and sintering the chamfered contact sheet containing laminate to form a multilayer ceramic substrate; and removing the contact sheet.

In a further aspect of the invention a composition for forming contact sheets is provided wherein the composition comprises a non-sinterable, non-metallic inorganic material having an average particle of less than about one micron and an organic binder. The contact sheet composition is used to form the contact sheet by known conventional methods such as the doctor blade method used to form ceramic greensheets.

In a further aspect of the invention, the microstructure of the contact sheet is modified to control the topography of metallized features on the surface of the substrate produced using contact sheets.

In a further aspect of the invention multilayer ceramic substrates made using the contact sheet composition and methods of the invention are provided.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
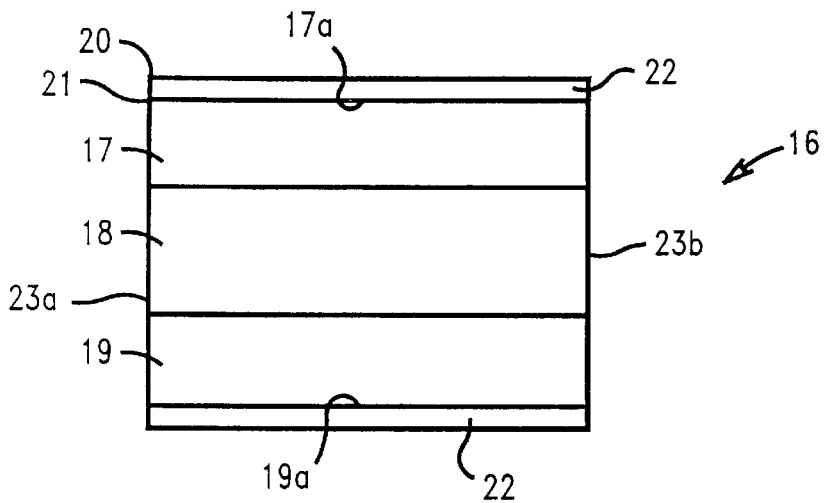
FIGS. 1A–1C show, in sequence, the making of a multilayer ceramic substrate according to the prior art.

In describing the preferred embodiment of the present invention, reference will be made herein to FIGS. 1A–5C. Features of the invention are not necessarily shown to scale in the drawings.

The ceramic greensheets used to make a multilayer ceramic substrate may be made by conventional casting methods using conventional greensheet casting compositions. Such compositions and methods are described in U.S. Pat. No. 2,966,719 to Park, Jr.; U.S. Pat. No. 3,698,923 to Stetson et al.; U.S. Pat. No. 4,769,294 to Barringer et al.; and U.S. Pat. No. 5,387,474 to Mikesha et al., which patents are hereby incorporated by reference. The composition is typically termed a casting slip and may be prepared by mixing the ingredients in a ball mill for a number of hours, such as 8 hours, to ensure that a homogenous mixture is formed and a desired viscosity obtained. A low temperature sinterable ceramic composition such as a crystallizable cordierite glass ceramic is made and formed into a greensheet. The binder may be selected from a large variety of polymers such as polyvinyl butyral, polyvinyl alcohol, or an acrylic resin. The binder is preferably a thermoplastic which allows joining of greensheets under heat and pressure. The solvent may also be selected from a wide variety of material such as methyl ethyl ketone (MEK), methyl isobutyl ketone (MIBK), methanol, acetone, toluene, etc. and is typically a mixture of two solvents which improve the binder solubility. The binder is preferably polyvinyl butyral or Butvar from Monsanto Corporation and the solvents are a mixture chosen from solvents considered to have good and poor solvency for the binder, preferably methanol and methyl isobutyl ketone in a ratio of 1 to 3 weight. A plasticizer such as dibutylphthlate is also preferably used in the formulation to improve lamination properties.

Typically, the slip composition is prepared in a two-stage milling process. In the first stage, the ceramic powder and solvent are mixed. In the second stage, the binder and plasticizer are added. The binder serves to retain the ceramic-particles in undisrupted position after the organic solvent is evaporated from the cast slip. A typical greensheet casting composition by weight percent is as follows:

|  | Broad | Preferred |
|---|---|---|
| Ceramic | 40 to 60% | 45 to 55% |
| Binder | 2 to 10% | 4 to 8% |
| Solvent | 20 to 50% | 35 to 45% |
| Plasticizer | 0.5 TO 5% | 1 TO 3% |

After the ingredients of the casting composition are mixed and homogenized, such as in a ball mill, a slip is formed having a viscosity which may vary from approximately 400 to approximately 2000 centipoise. The slip can be de-aired by means well known in the ceramic art. After de-airing, the slip is transferred to a slip reservoir where it is suitably maintained in a homogeneous state. From the reservoir, the slip is discharged through a small orifice onto a substantially-horizontal flexible tape. The flexible supporting tape is typically a tape made of any impervious material, such as polyteltrafluoroethylene "Teflon", glycol tetraphthalic acid polyester (Mylar) and the like. The casting sheet is pulled across the open bottom of the reservoir and under a doctor blade, which is set at a particular height to form the desired tape thickness. The casting sheet should be supported on a smooth surface and then the solvent vaporized producing a leather hard tape. During the casting operation and while evaporating solvents from the slurry to form the tape, the temperature and rate of removal of the solvents control the consolidation of the powders, binder and plasticizer and the development of the tape microstructure. This can also be controlled by the slurry composition and viscosity to produce microporosity consisting essentially of air bubbles within the tape. This can be measured by determining the apparent density of the tape. The tape can then be punched before or after removal of the casting sheet to form the desired greensheet size.

The greensheet may then be punched to form vias and metallized as well-known in the art and stacked to form the desired multilayer ceramic substrate laminate which is then fired (sintered) to form the final multilayer ceramic substrate product.

Sintering of the multilayer low temperature cofired ceramic laminate is conventionally performed using any of a number of heating profile cycles. Although not required, the application of pressure on the surface of the laminate during sintering to further increase the restraining force for XY shrinkage is often used. In general, the sintering of ceramic greensheets, and especially, low temperature cofired MLC packages using copper metallurgy, is typically performed in three distinct heating phases. The first phase pyrolysis breaks down large polymers and volatilizes the shorter chain organics. Pyrolysis is usually performed at a temperature below 500° C. for about 5 hours. The heating cycle where the binder and remaining organics are removed or burned out of the package (termed binder burn out "BBO") is usually performed at a temperature above about 700° C. for at least 2 hours. Sintering is then performed at a temperature between about 800° C. and 1000° C. to form the final MLC package. The total heating cycle is typically performed in a sintering environment which is a reducing atmosphere such as hydrogen or a nitrogen/hydrogen mixture. When metals such as gold or silver are used, a much simpler sintering process using predominately air atmospheres can be used.

The crux of the subject invention is to fabricate multilayer ceramic substrates as described hereinabove by using as the outermost layers of the stacked greensheets a contact sheet, the contact sheet comprising a non-sinterable, non-metallic inorganic material having an average particle size of approximately 1 micron or less in an organic binder. The contact sheet is formed preferably and typically using the doctor blade method as described hereinabove and then positioned on the stack typically by laminating the contact greensheet to the multilayer ceramic stack at the same time as all the other greensheet layers are made into a green monolithic laminate.

Preferably, the ceramic material used to form the contact sheet is alumina and is dispersed in a matrix of organic binder such as polyvinyl butyral and preferably contains a plasticizer such as phthalates or benzoates as is well known to those skilled in the art. The slurry formulation more particularly is made so that the microstructure of the contact sheet has a minimal amount of compressibility. The casting composition after ball milling and other dispersing steps is then cast via a conventional doctor blade technique to a thickness ranging from about 0.025 to 0.2 mm thick, and preferably less than about 0.050 mm thick when a minimal edge lip or burr is desired. The contact sheets are then positioned preferably on each surface of the greensheet multilayer ceramic substrate stack and laminated together under pressure at an appropriate temperature and time resulting in a laminate comprising in cross-section a multilayer stack of green sheets with preferably each outer surface having thereon a contact sheet. This is typically performed in a uniaxial pressing operation. A contact sheet or multiple contact sheets may be used on only one surface of the multilayer ceramic substrate but it is highly preferred to employ one or more contact sheets on each surface, with each surface covered by the same number and type of contact sheets.

Figure 1B:
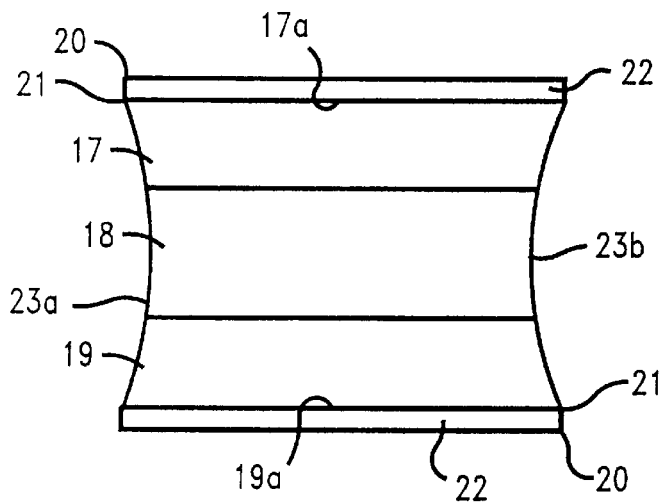
Figure 1C:
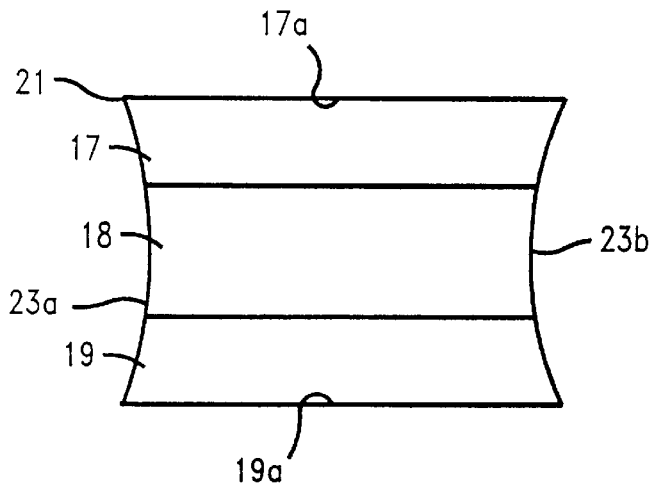

Typically, the laminate is then singulated into individual substrates for sintering to form the multilayer ceramic product. Referring first to FIGS. 1A–1C which show a typical prior art process for making a multilayer ceramic substrate product using contact sheets, a multilayer ceramic substrate stack is shown generally as 16. The multilayer ceramic substrate comprises stacked green sheets shown as 17, 18 and 19 having sides 23a and 23b and an upper surface 17a and a lower surface 19a. A contact sheet 22 is placed on each surface 17a and 19a. The top outer surface of the contact sheet is shown as 20 and the top outer surface of the substrate 17 is shown as 21. No edge chamfering is used. When the laminate of FIG. 1A is sintered typically under a constraining load, a product as shown in FIG. 1B is formed as having concave side walls 23a and 23b. When the contact sheets 22 are removed the final multilayer ceramic substrate product 16 is shown in FIG. 1C and it can be seen that the multilayer ceramic product 16 has concave side walls 23a and 23b formed by extended edges 21. In addition, the edges are very sharp and thus subject to extensive damage during handling thereafter. The surface smoothness of ceramic substrates made with contact sheets comprised of 3 micron alumina is typically about 9,000 to 10,000 Angstroms Ra.

Figure 3A:
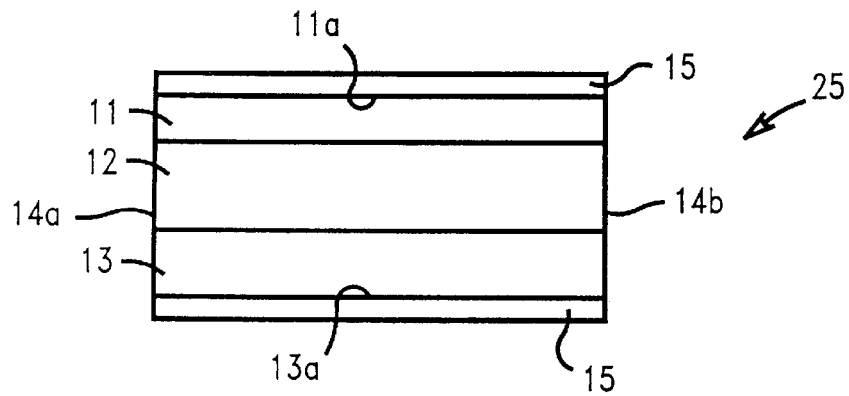
FIGS. 3A–3D show, in sequence, the making of a multilayer ceramic substrate according to another aspect of the prior art.
Figure 3B:
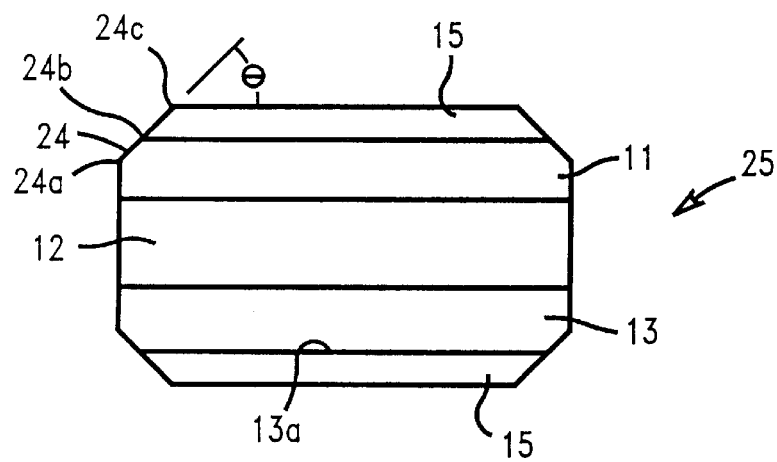
Figure 3C:
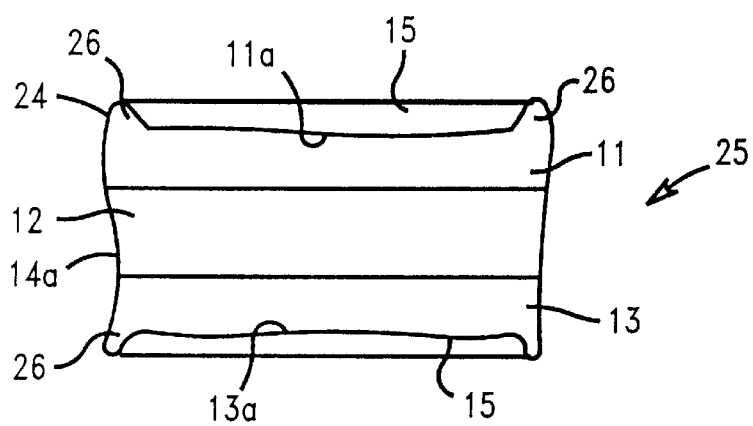
Figure 3D:
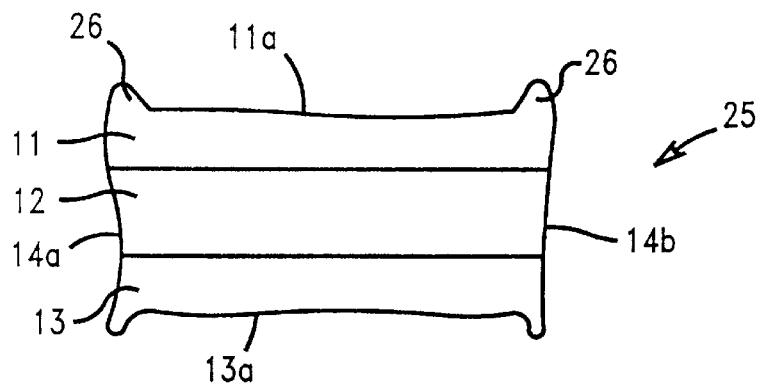

Referring now to FIGS. 3A–3D, to alleviate the sharp edges of ceramic substrates, it is typical prior art to chamfer the edges at a 45 degree angle. FIG. 3A shows the typical prior art laminate 25 with contact sheets 15 on the top and bottom of ceramic laminate 25. The contact sheets are typically 200 to 400 microns thick. FIG. 3B shows the same laminate after an edge chamfer 24 at approximately 45 degrees theta ($\theta$) has been made in the edges to alleviate the sharp edges anticipated after sintering and contact sheet removal. During sintering and while the part is constrained under a weight, the glass at the edges of the substrate can typically flow during the Z shrinkage of the substrate. Since the contact sheet does not sinter and the glass is free to flow around its edges while being sintered and pressed under a load, the edge chamfer 24 of the substrate after sintering often has a lip or burr 26 as shown in FIG. 3C. After the contact sheet is removed as shown in FIG. 3D the burr 26 is very pronounced and easily subject to chipping. In addition, the surface is not planar which can affect the sealing of the substrate on joining fixtures and the integrity of lids attached to the surface. Removal of this lip can only be done by expensive abrasive planarizing processes often with diamond tooling. The side wall edge 14a and 14b concavity is still very noticeable which can affect the edge registration of the substrate in sockets as well as create chipping problems in handling.

Figure 2A:
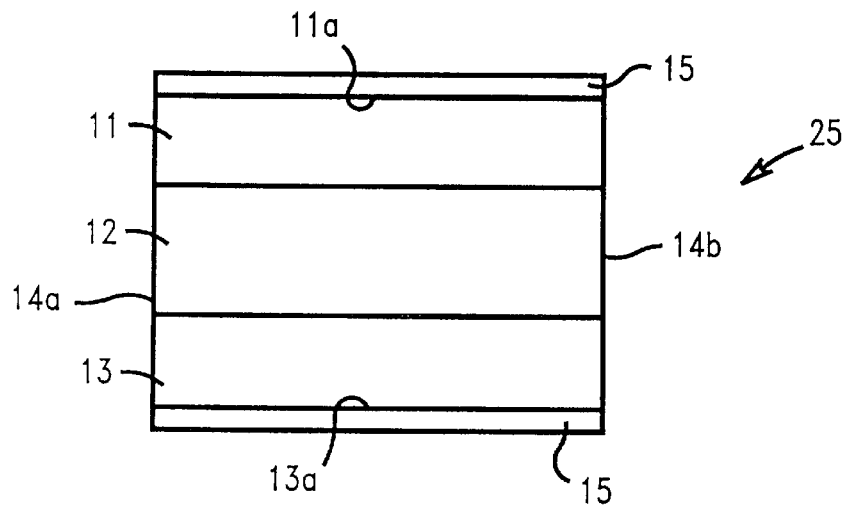
FIGS. 2A–2C show, in sequence, the making of a multilayer ceramic substrate using contact sheets of the invention to control edge features.
Figure 2B:
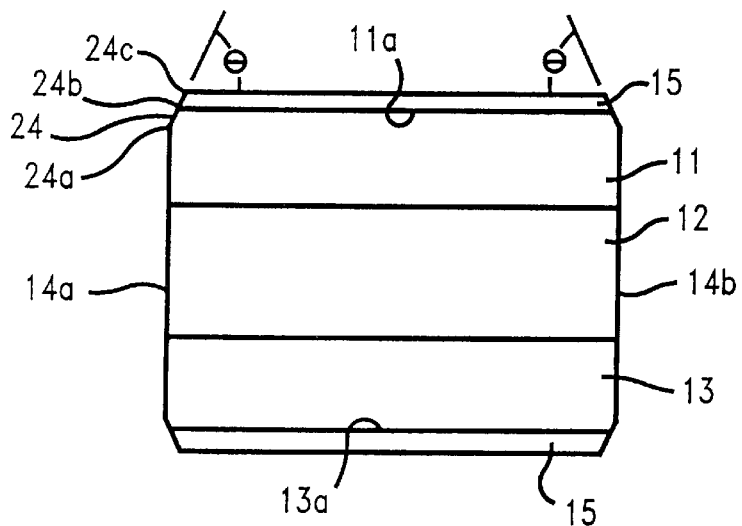
Figure 2C:
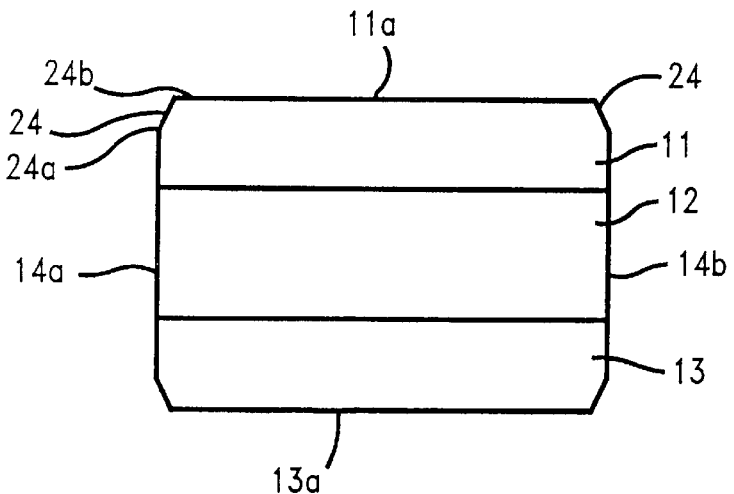

Referring now to FIGS. 2A–2C, a preferred fabrication method of the invention is shown. A multilayer ceramic product shown generally as 25 comprises a plurality of stacked green sheets 11, 12 and 13 and a contact sheet 15 of the invention on each surface 11a and 13a. Contact sheet 15 is less than 3 mils thick and preferably less than 2 mils to minimize any edge lip that may occur when the ceramic material flows around the edge of the chamfered contact sheet. The substrate 25 is shown having side walls 14a and 14b.

In FIG. 2B, each edge of the product 25 is shown having an edge chamfer 24 at an angle $\theta$ greater than about 60°. It will be appreciated that there are a total of eight edges on the rectangular stack—four on top and four on the bottom. At one edge for example the chamfer extends from a point 24a on greensheet 11 upward to the surface 11a shown as point 24b and terminates at point 24c at the upper surface of contact sheet 15. Angle $\theta$ is greater than about 60° and the chamfer may extend downward along side walls 14a and 14b of substrate 11 a suitable distance, typically about 20% to 40% of the thickness of the laminate 25. Less than this amount of chamfer makes the substrate prone to forming concave edges.

After sintering and removal of the contact sheet 15 the final product 25 is shown in FIG. 2C. The Multilayer substrate 25 product is shown having substantially straight side walls 14a and 14b. Chamfer 24 is still in the product. The surfaces 11a and 13a of the substrate 11 are also smooth due to the use of the contact sheet of the invention.

Comparing the prior art product of FIG. 3D to the product of the invention of FIG. 2C, it is clear that the use of a chamfer angle of greater than about 60 degrees and a contact sheet of the invention produces a product without an edge burr and which has straighter side walls. Thus, the product requires less finishing processes to provide the finished product.

The contact sheets of the current invention can also be used to control the topography of surface metallization. This is desirable when the metal features on the surface of the substrate are required to protrude or desired to be level with the surface of the substrate for interconnection to, for instance, a Land Grid Array connector.

At the time the contact sheets are made during the casting operation the microstructure of the contact sheets is controlled by the slurry composition and casting conditions. A very slow casting rate at low temperature with slow evaporating solvents can be used to produce a very dense contact sheet. A rapid casting rate at elevated temperatures can be used to produce a porous contact sheet. During lamination a contact sheet with a porous microstructure compresses slightly. The amount the contact sheet compresses after lamination compared to its initial thickness is expressed as the compressibility, typically in percent. Sheets that have little porosity have very little compressibility and conversely sheets with high porosity have higher compressibility.

Figure 4A:
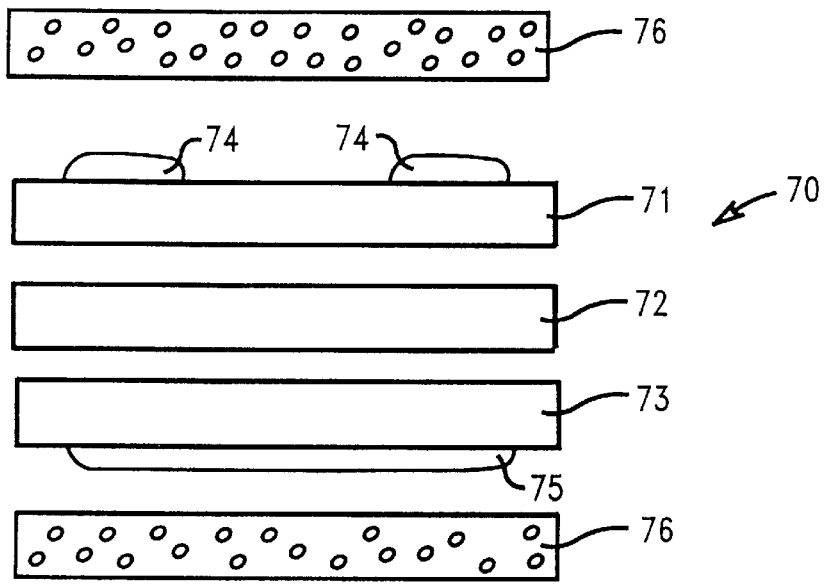
FIGS. 4A–4C show, in sequence, the making of a multilayer ceramic substrate using compressible contact sheets of the invention to control the topography of metal features.
Figure 4B:
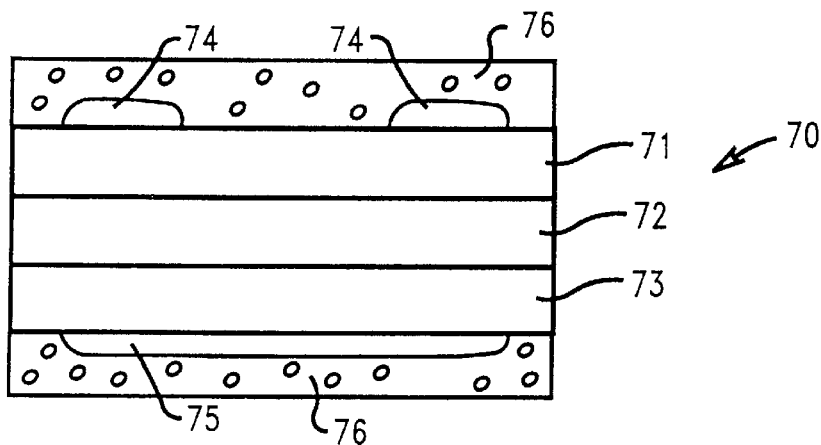
Figure 4C:
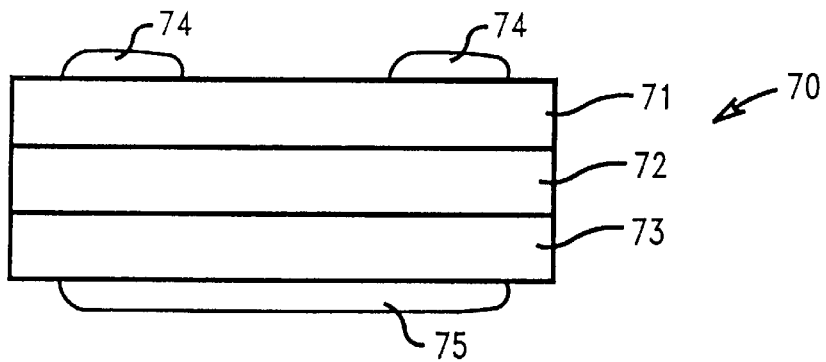
Figure 5A:
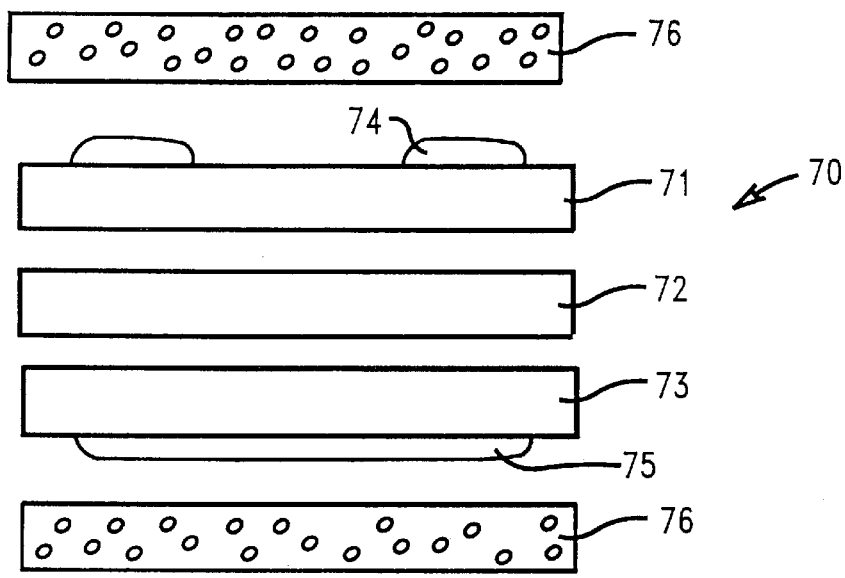
FIGS. 5A–5C show, in sequence, the making of a multilayer ceramic substrate using low compressible contact sheets of the invention and the resultant surface metal topography.
Figure 5B:
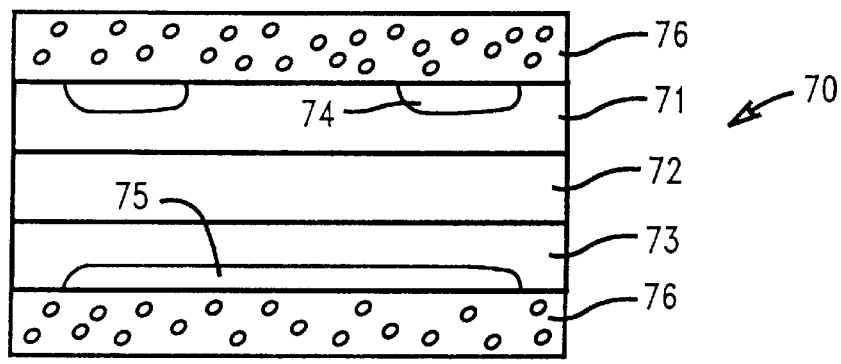
Figure 5C:
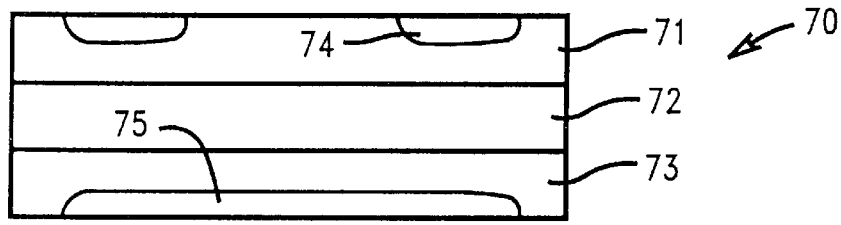

During lamination surface metal features are embedded into the contact sheet. This is shown in FIGS. 4A–4C. Referring to FIG. 4A a typical lamination process includes placing contact sheets 76 on each side of a stack 70 of metallized ceramic layers. The top and bottom layers 71 and 73 respectively have surface metallization features 74 and 75 such as IO pads or solderable features for attaching components. The entire stack is then pressed in a uniaxial press under elevated temperature and pressure for a fixed time to thermoplastically bond the layers together. If contact sheets with high compressibility are used the surface metal features 74 and 75 are embedded into the contact sheets. A compressibility greater than 6% is considered high. This is shown in FIG. 4B. After sintering and removal of the contact sheets the surface metal features are found to be raised above the ceramic surface as shown in FIG. 4C. Now referring to FIG. 5A, contact sheets 76 are shown having low porosity and compressibility, typically less than 6%. Again these are used on the top and bottom of a stack of metallized ceramic layers 71, 72 and 73. After lamination the surface metal features are embedded into the outermost ceramic layers as shown in FIG. 5B. After sintering and contact sheet removal the metal surface features are found to be essentially level with the surface of the ceramic. This is shown in FIG. 5C.

When planar ceramic and metal surfaces are desired, thin contact sheets with low compressibility are used. Additionally, a hard surface is used to contact the contact sheet during the lamination process. This is typically a metal plate with a release coating or Mylar layer between it and the contact sheet to prevent sticking.

Referring to FIG. 2C the surfaces 11a and 13a of the multilayer ceramic substrate products made using the method of the invention are smoother than the comparable prior art multilayer ceramic substrate product shown in FIGS. 1C and 3D. This smoothness is the result of using the contact sheets of the invention which are made using a fine particle size ceramic which has been found to enhance the smoothness of the products of the invention. The smoothness is typically 3 to 10 times smoother than obtained with contact sheets made using conventional particle size alumina. The submicron alumina contact sheet also provides at least about a 50% reduction in sintering distortion referred to as the difference between the desired location of a surface feature and the actual location of that feature as compared to typical contact sheets formulated with typical "coarse" particle size alumina as shown in FIGS. 1C and 3D. This difference can be measured by an optical measurement system.

An additional feature of the invention is that contact sheets formulated with the sub micron size alumina powder are much more completely removed after sintering by a non-contact method such as an aqueous ultrasonic bath than for conventionally made contact sheets. Further, if any of the contact sheet particles are not removed from metal features, subsequent metallurgical processes, particularly nickel and gold plating operations are not significantly adversely affected due to the small particle size of the ceramic contact sheet residue. It has been found that typical coarse particle size alumina contact sheets can be removed with ultrasonics however, a 3–4 time factor reduction has been experienced when using the contact sheets of the invention.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for making multilayer ceramic substrates having enhanced dimensional integrity from ceramic greensheets by sintering comprising the steps of:

stacking a plurality of greensheets having metallurgical circuitry within and whereon and which will form a multilayer ceramic substrate when sintered;

forming a contact sheet comprising a non-sinterable, non-metallic inorganic material and an organic binder;

positioning the contact sheet on at least one surface of the stack;

forming a laminate by adhering the contact sheet and greensheets together to form a contact sheet containing stack;

forming a chamfer around the edges of the contact sheet containing stack to form a chamfered contact sheet containing stack, the chamfer angle being greater than about 60° in relation to the surface of the contact sheet;

sintering the chamfered contact sheet containing stack to form a multilayer ceramic substrate; and removing the contact sheet.

2. The method of claim 1 wherein the circuitry is copper.

3. The method of claim 1 wherein the inorganic material is alumina.

4. The method of claim 1 wherein the contact sheet is formed under conditions to provide compressibility of the contact sheet greater than about 6%.

5. A method for making multilayer ceramic substrates having enhanced dimensional integrity from ceramic greensheets by sintering comprising the steps of:

stacking a plurality of greensheets having metallurgical circuitry within and thereon and which will form a multilayer ceramic substrate when sintered;

forming a contact sheet comprising a non-sinterable, non-metallic inorganic material and an organic binder having an average particle size less than about one micron and an organic binder;

positioning the contact sheet on at least one surface of the stack;

forming a laminate by adhering the contact sheet and greensheets together to form a contact sheet containing stack;

forming a chamfer around the edges of the contact sheet containing stack to form a chamfered contact sheet containing stack, the chamfer angle being greater than about 60° in relation to the surface of the contact sheet;

sintering the chamfered contact sheet containing stack to form a multilayer ceramic substrate; and removing the contact sheet.

6. The method of claim 5 wherein the circuitry is copper.

7. The method of claim 5 wherein the inorganic material is alumina.

* * * * *

UNITED STATES PATENT AND TRADEMARK OFFICE
CERTIFICATE OF CORRECTION

PATENT NO. : 6,139,666
DATED : October 31, 2000
INVENTOR(S) : Benjamin V. Fasano et al.

It is certified that error appears in the above-identified patent and that said Letters Patent is hereby corrected as shown below:

IN THE SPECIFICATION

In column 3, line 9, delete "Chip-Scale Package" and substitute therefor - - Chip-Scale-Package - - .

In column 4, line 65, after "contact sheet;" delete "and".

In column 5, line 55, delete "Mikesha" and substitute therefor - - Mikeska - - .

IN THE CLAIMS

In column 10, line 16, delete "whereon" and substitute therefor - - thereon - - .

Signed and Sealed this

Eighth Day of May, 2001

Attest:

NICHOLAS P. GODICI

Attesting Officer     Acting Director of the United States Patent and Trademark Office